United States Patent
Dinoi et al.

(10) Patent No.: US 7,702,969 B2
(45) Date of Patent: Apr. 20, 2010

(54) METHODS FOR THE GENERATION OF S-RANDOM INTERLEAVERS FOR TURBO DECODERS WITH A PARALLEL STRUCTURE

(76) Inventors: Libero Dinoi, Via Pier Carlo Boggio 61 (Passo Carraio), Torino (IT) I-10138; Sergio Benedetto, Corso Duca Degli Abruzzi 24, Torino (IT) I-10129

( * ) Notice: Subject to any disclaimer, the term of this patent is extended or adjusted under 35 U.S.C. 154(b) by 1150 days.

(21) Appl. No.: 11/290,455

(22) Filed: Dec. 1, 2005

(65) Prior Publication Data

US 2006/0156170 A1      Jul. 13, 2006

(30) Foreign Application Priority Data

Dec. 1, 2004    (EP)    .................................. 04425905

(51) Int. Cl.
  *G06F 11/00*    (2006.01)
  *G11C 29/00*    (2006.01)
  *H03M 13/00*    (2006.01)

(52) U.S. Cl. ........................ 714/701; 714/702; 714/774
(58) Field of Classification Search .................. 714/701, 714/702
See application file for complete search history.

(56) References Cited

U.S. PATENT DOCUMENTS 6,453,442 B1 *   9/2002   Sadjadpour et al. .......... 714/787
6,678,843 B2 *   1/2004   Giulietti et al. ............. 714/701

OTHER PUBLICATIONS

Nimbalker, A.; Fuja, T.E.; Costello, D.J., Jr.; Blankenship, T.K.; Classon, B.; Contention-free interleavers; International Symposium on Information Theory, 2004; Jun. 27-Jul. 2, 2004; p. 52.*

S.Benedetto, et al. "Soft Input Output Modules for the Construction and Distributed Iterative Decoding of Code Networks", European Transactions on Telecommunications, vol. 9, Iss. 2, Mar. 1998, pp. 155-172).

D. Gnaedig et al., "On Multiple Slice Turbo-Codes", Proc. $3^{rd}$ International Symposium on Turbo-Codes and Related Topics, Brest, France, 2003, pp. 343-346 (abstract).

Examination Report for European Application No. 04425905.9 filed Dec. 1, 2004.

(Continued)

*Primary Examiner*—Joseph D Torres
(74) *Attorney, Agent, or Firm*—Perkins Coie LLP

(57) ABSTRACT

The method allows to obtain, starting from an initial S-random interleaver permutation, stored in memory devices and having a spread S, a size K and a degree of parallelism M<K, and collision-free, an interleaver permutation having an increased size, which is also collision-free, by an expansion technique which is carried out by electronic processing devices connected to the memory devices. In each of the subsequent iteration, the initial interleaver permutation is added with M terms or elements which obey a predetermined condition, inserted in respective positions which satisfy a predetermined relationship.

In each of said iterations, the choice of the values the M elements added to the permutation is made by means of a procedure which implements a predetermined optimisation criterion, adapted to maximise the spread value of the resulting interleaver permutation.

10 Claims, 2 Drawing Sheets

OTHER PUBLICATIONS

A. Nimbalker, et al.: "Contention-free interleavers" Internet Article, 'Online! Jun. 2004, XP002322035, Retrieved from the Internet: URL:http//www.nd.edu/_{animbalk/Papers/ISIT2004.pdf> ' retrieved on Mar. 18, 2005.

A. Nimbalker, et al.: "Contention-free interleavers" Proceedings. 2004 IEEE International Symposium of Information Theory (IEEE Cat. No. 04CH37522) IEEE Piscataway, NJ, USA, Jul. 2, 2005, p. 54, XP002322036, ISBN: 0-7803-8280-3.

M. Ferrari, et al.: "Prunable S-random interleavers" ICC 2002. 2002 IEE International Conference on Communications. Conference Proceedings. New York, NY, Apr. 28-May 2, 2002, IEEE International Conference on Communications, New York, NY: IEEE, US, vol.. vol. 1 of 5, Apr. 28, 2002, pp. 1711-17158, XP010589779, ISBN: 0-7803-7400-2.

L. Dinoi, et al.: Design of Prunable S-Random Interleavers International Symposium on Turbo Codes and Related Topics, XX, XX, Sep. 30, 2003, pp. 279-282, XP001203420.

L. Dinoi, et al.: "Design of Prunable S-Random Interleavers" Internet Article, 'Online! Aug. 27, 2004, XP002322037, Retrieved from the Internet: URL: http://cyclops.polito.it/Papers/files/TWO3.pdf> 'retrieved on Mar. 22, 2005.

A. Tarable, et al.: "Mapping Interleaving Laws to Parallel Turbo Decoder Architectures" IEEE Communications Letters, IEEE Service Center, Piscataway, US, US, vol. 8, No. 3, Mar. 2004, pp. 162-164, XP001192711, ISSN: 1089-7798.

J. Kwak, et al.: "Design of Dividable interleaver for parallel decoding in turbo codes" Electronics Letters, IEE Stevenage, GB, vol. 38, No. 22, Oct. 22, 2004, pp. 1362-1364, XP006019128, ISSN: 0013-5194.

A. Giulietti, et al.: "Parallel trubo coding interleavers: avoiding collisions in accesses to storage elements" Electronics Letters, IEE Stevenage, GB, vol. 38, No. 5, Feb. 28, 2002, pp. 232-234, XP006018151, ISSN: 0013-5194.

M. Eroz, et a.: On the design of prunable interleavers for turbo codes Vehicular Technology Conference, 1999 IEEE.$49^{th}$ Houston, TX, USA, May 16-18, 1999, Piscataway, NJ, USA, IEEE, US, vol. 2, May 16, 1999, pp. 1669-1673, XP010342111, ISBN: 0-7803-5565-2.

D Gnaedig, et al.: "On Multiple Slice Turbo Codes" Internet Article, 'Online! Apr. 4, 2003, XP002322038, Retrieved from the Internet: URL:http:/lester.univ-ubs.fr:8080/_{boutillon/articles/Turbo_03_TCR_.pdf> 'retrieved on Mar. 21, 2005.

* cited by examiner

METHODS FOR THE GENERATION OF S-RANDOM INTERLEAVERS FOR TURBO DECODERS WITH A PARALLEL STRUCTURE

The present invention relates generally to coding systems for digital communications and particularly to methods or procedures for the generation of S-random interleavers for turbo-decoders having a parallel structure.

In particular the invention relates more specifically to procedure or method of the kind defined in the introductory portion of claim 1.

In the present description as well as in the following claims, according to an established practice in this field, by "interleaver" it is meant the "interleaver permutation" or "interleaver law" associated with an interleaver device in the proper sense of the word.

Interleavers play a crucial role in systems using turbo-codes.

Interleavers of the S-random type represent, as it is well-known, an optimum class of interleavers and, differently from any other permutation systems, are sufficiently robust with respect to the specific convolutional codes employed and to the puncturing rate applied to the overall code.

Many application systems require a great flexibility in terms of block length and code-rate and the change of these parameters involves a corresponding modification of the interleaver size. In such cases, it is highly recommendable to obtain, by use of an algorithm, all the needed interleavers from a mother interleaver which exhibits the largest size, avoiding the need to store all the necessary permutation laws.

Unfortunately, the known pruning techniques disclosed in the literature for the obtention of S-random interleavers with smaller sizes starting from an initial S-random interleaver of a larger size generally destroy the properties of the obtained interleavers.

On the other hand, the characteristics of modern communication systems require high data-rates in the order of several hundred Mbit/s, accompanied by low latency. Meaningful examples are fibre optic communication systems, or multimedia applications, requiring the transfer of large batches of data. Owing to the iterative nature of the decoding algorithms used with turbo-codes, it is often difficult to satisfy the aforementioned requirements with an affordable implementation complexity.

A possible solution consists in implementing the turbo-decoders according to a parallel structure, diving a block in sub-blocks, each of which is decoded by a corresponding SISO (Soft Input Soft Output) module according to a bidirectional "sliding window" technique, as it is disclosed for instance in S. Benedetto, D. Divsalar, G. Montorsi and F. Pollara, "Soft Input Soft Output modules for the construction and distributed iterative decoding of code networks", European Transactions on Telecommunications, Vol. 9, Iss. 2, March 1998, pp. 155-172. In this way the throughput of the decoders is increased, and the latency of the system becomes the latency introduced by each sub-block. However, these advantages are obtained at the expense of additional hardware and an increased occupied area (the SISO modules have to be necessarily replicated, and the communication between the different modules has to be ensured).

According to that solution, in order that the different SISO modules may be able to work in parallel, it is necessary to store the information read and written by each module in different RAM memories. While in a first iteration phase or semi-iteration, the SISO modules write and read data always on a same RAM memory bank, in the subsequent phase or semi-iteration it can happen, depending on the specific interleaver law, that different SISO modules try to access simultaneously the same RAM memory. In this case, none of them is able to read or write data, so that the access to the memory has to be postponed and carefully "arbitrated", thus further slowing down the decoding process.

This represents the so-called "collision" problem, as disclosed for instance in A. Giulietti, L. Van der Perre and M. Strum, "Parallel Turbo Cording Interleavers: Avoiding Collisions in Accesses to Storage Elements", Electronics Letters, Vol. 38, Iss. 5, February 2002, pp. 232-234. This publication proposes a solution to that problem, consisting in a deterministic rule for generating collision-free interleavers.

Other known techniques propose solutions to avoid the collisions induced by non-prunable interleavers.

It is an object of the present invention to propose a method which allows to obtain collision-free S-random interleavers which maintain this collision-free property also when pruned.

This and other objects are achieved according to the invention by the method the main features of which are defined in annexed claim 1.

According to a further aspect of the invention, in each iteration of the incremental method, the selection of the values of the M elements which are added to the interleaver permutation is made according to a technique which implements a predetermined optimisation criterion, tending to maximise the spread value of the resulting interleaver permutation.

Further characteristics and advantages of the invention will become apparent from the detailed description which follows, provided merely as a non-limiting example, with reference to the enclosed drawings in which.

Figure 1:
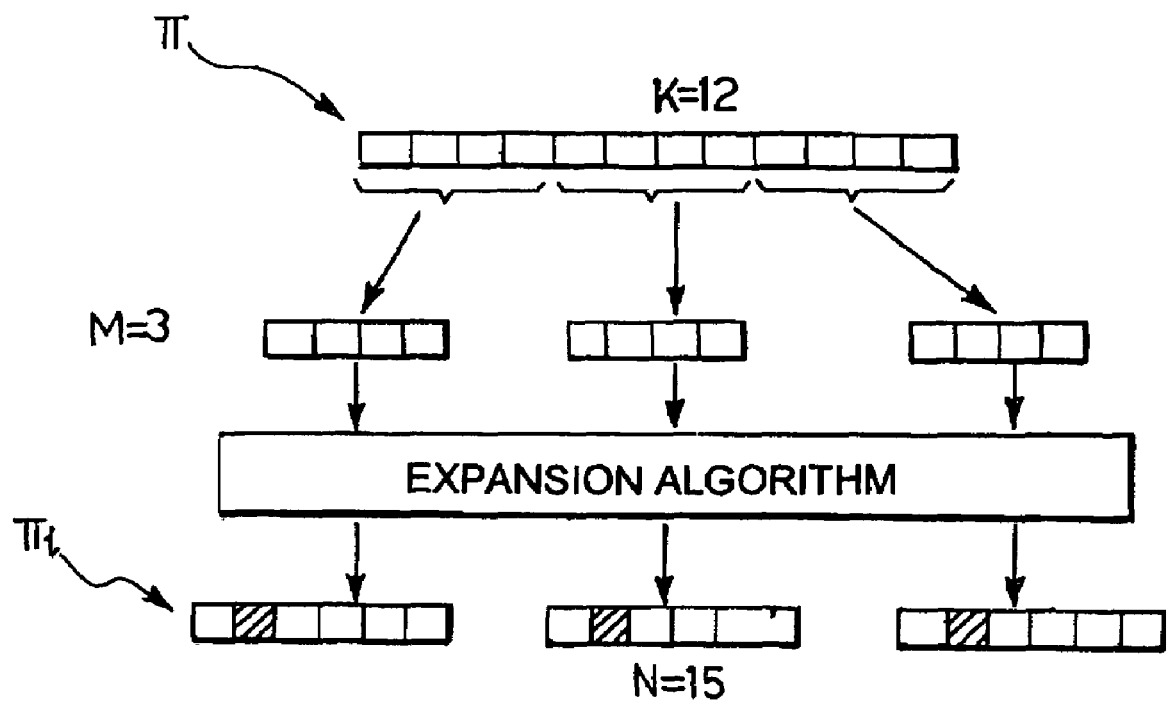
FIG. 1 is a diagram useful for explaining, qualitatively, the techniques for expanding an interleaver for use with a decoder having a parallel structure.

According to the invention, it is hereby proposed an incremental technique or method for obtaining, starting from an initial S-random interleaver permutation $\Pi$ (FIG. 1), stored in electronic memory devices and having a spread S, a size K and a degree of parallelism M ($<$K) and collision-free, another interleaver permutation $\Pi_I$, which is also collision-free. According to the invention, this is achieved by means of an expansion algorithm or technique which is carried out by means of electronic processing devices.

In the method or technique according to the invention in each of the subsequent iterations, the initial interleaver permutation is added with M terms or elements, which comply with the following condition:

$$\forall i \in \left[0; \frac{K}{M} - 1\right], \forall j, k \in [0, M-1], \quad (1)$$

$$\text{with } j \neq k: \left\lfloor \Pi\left(i + \frac{K}{M}j\right) \Big/ (K/M) \right\rfloor \neq \left\lfloor \Pi\left(i + \frac{K}{M}k\right) \Big/ (K/M) \right\rfloor$$

wherein i, j, k are indices which indicate the position of the terms or elements in the permutation $\Pi$, K is the length or size of the initial interleaver, and M is the degree of parallelism thereof.

The above-mentioned M added terms or elements are introduced in the initial interleaver in respective positions $i_z$ such that $$i_{z+1} = \left(i_z + \frac{K}{M}\right)_{modK}, z = 0, \ldots, K-1 \quad (2)$$

Figure 2:
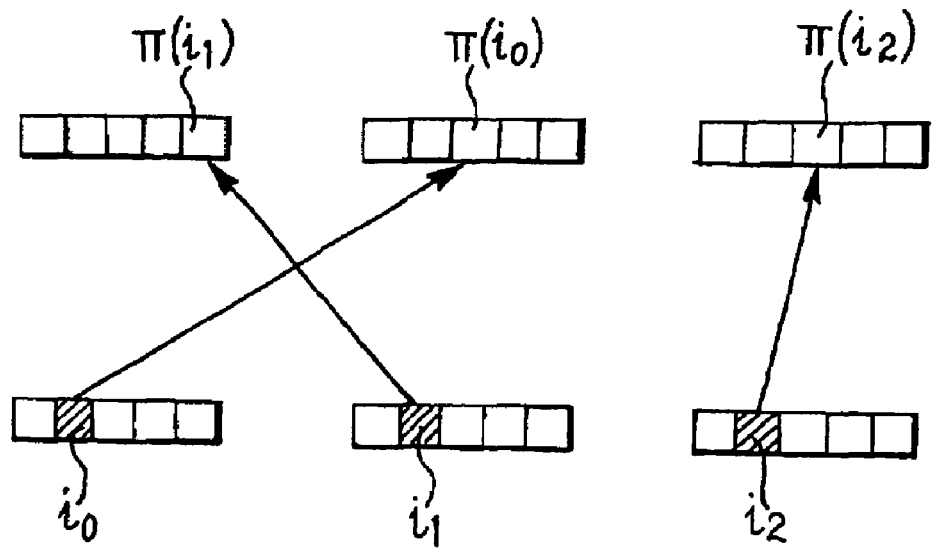
FIG. 2 is a further diagram useful for illustrating the techniques of inserting additional elements into the sub-blocks of an interleaver block.

If the new elements which are inserted in the positions defined by condition (2) also satisfy condition (1), as in the example presented in FIG. 2, then also the obtained interleaver is still collision-free.

In the method or technique according to the invention the choice of the new, additional elements to be introduced into the interleaver is not made at random, but is instead preferably the result of an optimisation tending to achieve a fast growth of the spread factor with the increase in size of the interleaver.

To the end of ensuring a fast growth of the spread properties of the thus obtained interleavers, at each iteration it is seen which pairs of positions (i, j) and terms ($\Pi(i)$, $\Pi(j)$) in the initial permutation correspond to the violations that do not permit to reach a spread value increased by 1.

Then a new element or term is inserted in the permutation, in a position belonging to the interval $[min(i,j)+1; max(i,j)]$, or a new element or term with a value belonging to the interval $[min((\Pi(i), \Pi(j))+1; max(\Pi(i), \Pi(j))]$ and this is continued as long as this insertion does not introduce new spread violations.

The improved method for the construction of interleavers described above can be carried out for instance with the procedure and the relevant sub-routines which are presented herebelow in a pseudo-code formalism.

Main Procedure

Set dim=K, S=$S_{in}$
LOOP UNTIL dim=N
∀ spread violation, build the two suitability lists $A_1$, $A_2$:
   ∀ k∈[min(i,j)+1, max(i,j)], set $A_1$(k mod (dim/M))=$A_1$ (mod (dim/M))+1
   ∀ k∈[min($\Pi(i)$, $\Pi(j)$)+1; max($\Pi(i)$, $\Pi(j)$)], set $A_2$(k)=$A_2$(k)+1
Sorting $A_1$ and $A_2$ in descending order, we write the original positional indices of their elements in vectors $B_1$ and $B_2$
Set level=1
∀ k=1,2,...,dim/k
   Set the M-uple i={$B_1$(k),$B_1$(k)+dim/M,...,$B_1$(k)+(M-1) dim/M}
   Make a copy $C_2$ of $B_2$, and move to the bottom of $C_2$ and mark as forbidden all the elements of $C_2$ that, chosen as $\Pi(i(0))$, would lead to violations of spread S+1
   ∀ q=1,2,..., to the last valid element of $C_2$:
     Set level=level+1
     Set Y(0)=$C_2$ (q)
     Answer=Bbox($\Pi$,Y,i, level,S+1,dim+1,$B_2$)
     If Answer=OK,
        Insert ($\Pi$,Y,i).
        Jump to TAG_1
     Set q=q+1
   Set k=k+1
% Same as before, but with a lower spread parameter (emergency procedure) %
Set level=1
∀ k=1,2,...,dim/M
   Set the M-uple i={$B_1$(k),$B_1$(k)+dim/M,...,$B_1$(k)+(M-1)dim/M}
   Make a copy $C_2$ of $B_2$, and move to the bottom of $C_2$ and mark as forbidden al the elements of $C_2$ that, chosen as $\Pi(i(00))$, would lead to violations of spread S+1
   ∀ q=1,2,..., to the last valid element of $C_2$:
     Set level=level+1
     Set Y(0)=$C_2$ (q)
     Answer=Bbox($\Pi$,Y,i,level,S,dim+1,$B_2$)
     If Answer=OK,
        INSERT($\Pi$,Y,i).
        Jump to TAG_1
   Set k=k+1
% TAG_1→
Set dim=dim+M
If there are no more (S+1)-spread violations set S=S+1
END OF LOOP

Bbox ($\Pi$, Y, i, Level, S, Dim, $B_2$)

Set w=0
LOOP UNTIL w=i(level−2)
If $\Pi(w) \geqq =Y(level−2)$, then set $\Pi'(w)=\Pi(w)+1$ else set $\Pi'(w)=\Pi(w)$
Set w=w+1
END OF LOOP
Set w=dim−1
LOOP UNTIL dim w=i(level−2)
If $\Pi(w) \geqq =Y(level−2)$, then set $\Pi'(w)=\Pi(w−1)+1$, else set $\Pi'(w)=\Pi(w−1)$
Set w=w−1
END OF LOOP
Set $\Pi'$(level−2)=Y(level−2)
Make a copy $C_2$ of $B_2$, and move to the bottom of $C_2$ and mark as forbidden al the elements of $C_2$ that, chosen as $\Pi'$(i(level−1)), would lead to violations of spread (S)
∀ k=1,2,..., to the last valid element of $C_2$:
   Set Y(level−1)=$C_2$(k)
   If the M values of Y satisfy the parallelism condition, return Answer=OK
   If level is not equal to M:
     Answer=Bbox($\Pi$,Y,i,level+1,S,dim+1,$B_2$)
     If Answer=OK, return Answer=OK
   Set k=k+1
Return ANSWER=NOT OK

Insert ($\Pi$, Y, i)

Set q=0
LOOP UNTIL q=M−1
   Set l=dim−1
   LOOP UNTIL l=i(q)
     If $\Pi(l) \geqq =Y(q)$, set $\Pi(l+1)=\Pi(l)+1$, else set $\Pi(l+1)=\Pi(l)$
     Set l=l−1
   END OF LOOP
   Set l=0
   LOOP UNTIL l=i(q)
     If $\Pi(l) \geqq =Y(q)$, set $\Pi(l)=\Pi(l)+1$
     Set l=l+1
   END OF LOOP
   Set $\Pi(i(q))$=Y(q)
   Set dim=dim+1
Set q=q+1
END OF LOOP In connection with the above-disclosed procedure, the following comments apply.

According to the procedure, for each spread violation two suitability lists or vectors, $A_1$ and $A_2$, are formed, for the positions of the new elements to be inserted in the interleaver and their values, respectively.

The list $A_1$ has a length dim/M, i.e. comprises dim/M terms or elements, each of which indicates the number of solved spread violations.

The list $A_2$ has a length equal to dim.

The suitability lists $A_1$ and $A_2$ are then sorted or reordered in decreasing order of their terms, so that the first terms of said lists or vectors are those which solve the largest numbers of spread violations.

The procedure continues then with the creation of vectors $B_1$ and $B_2$ containing the original positional indices of the elements or terms of $A_1$ and $A_2$ before the latter are sorted or reordered.

Then, a copy $C_2$ of $B_2$ is made. The elements or terms of $C_2$ are analysed and those which would lead to spread violations are moved to the bottom of $C_2$, and are marked as "forbidden", i.e. "non-valid" (for instance by applying a negative sign thereto).

The parameter "level" indicates which sub-block is being analysed and attempted to be put in order.

$Y(0)$ is the value of the element in position $i_0$, i.e. the element which is inserted into the first sub-block (see also FIG. 2).

The main procedure calls then a subroutine Bbox, which is essentially a recursive procedure which determines the values of the new elements to be inserted in the remaining M−1 sub-blocks, and checks whether the M values of Y comply with the condition of parallelism (1) presented above.

At each iteration, if it is not possible to find out M elements which, when inserted into the M sub-blocks, allow to increase the spread of the interleaver, an "emergency procedure" is launched, attempting to find out M values which at least maintain the spread value of the preceding interleaver.

The validity of the above-described method has been tested, by generating four families of collision-free S-random interleavers, with degrees of parallelism ranging from 2 to 5, starting from a size K=20 and extending them up to a final length N=16,000 (in the case of M=2), and up to a final length N=8,000 (in the case of M=5). The obtained results have been optimum, in terms of spread, as well as in terms of dispersion and FER (Freme Error Rate).

The method disclosed above appears however to be heavily demanding under a computational point of view for large values of the degree of parallelism M, in particular when M is grater than 5.

Thus we will now describe a variant of the method according to the invention, which can be conveniently utilised in particular for interleaver permutations having a high degree of parallelism M, in particular with M greater than 5.

According to this variant, an interleaver permutation with an increased length is obtained by combining a temporal permutation $\Pi_t$ and a spatial permutation $\Pi(s)$, for instance as disclosed in D. Gnaedig et al., "On Multiple Slice Turbo-Codes", Proc. 3rd International Symposium on Turbo-Codes and Related Topics, Brest, France, 2003, pp. 343-346.

The K/M elements or terms of the temporal permutation $\Pi_t$ indicate which position in the memory banks is to be accessed by the M SISO modules in each moment.

The spatial permutation $\Pi_s$, on the other hand, defines in each moment the associations between the modules and the memory banks of the decoder.

The main problem inherent to this approach is the regularity of the resulting permutation, and the difficulty in optimising the spread properties.

In fact, a collision-free interleaver $\Pi$ can be obtained, starting from a standard S-random permutation $\Pi_0$ by imposing the condition $$\forall i \in \left[0; \frac{K}{M}-1\right], \forall j \in [0; M-1]: \Pi_n\left(i+\frac{K}{M}j\right) = \Pi_o(i) + \frac{K}{M}[\Pi_s(\Pi_o(i)_{modP})+j]_{modM} \quad (3)$$

wherein $\Pi_0$ is a temporal permutation, and $\Pi_s$ is a spatial permutation.

Without taking any specific measures, the resulting interleaver is likely to exhibit a spread smaller than that of $\Pi_o$.

In order to preserve the spread properties of the temporal permutation, independently of the specific spatial permutation utilised, it is necessary to satisfy the following relationship:

$$\min\left(|\Pi(i)-\Pi(j)|, \frac{K}{M}-|\Pi(i)-\Pi(j)|\right) + \min\left(|i-j|, \frac{K}{M}-|i-j|\right) > S_{tr} \quad (4)$$

wherein $S_{tr}$ is the spread to be preserved.

By generating a family of prunable S-random interleavers, in accordance with the relationship (4) above, it is easy to obtain a family of collision-free S-random interleavers having a spread equal to that of the relevant temporal permutation $\Pi_o$, i.e. roughly equal to $\sqrt{K/M}$.

This means that, with even a degree of parallelism M as small as 4, one would result in halving the ideal spread factor.

According to the invention this inconvenient is significantly reduced if the above-mentioned combination of spatial and temporal permutations is coupled to the expansion method or technique disclosed in the initial portion of the present description.

For the achievement of an interleaver permutation having a degree of parallelism of $M=M_bR$, wherein R is an integer, according to the invention as the temporal permutation a collision-free S-random permutation is used, having a degree of parallelism equal to $M_b$ and complying with the relationship (4) presented above.

Conveniently, the spatial permutation $\Pi_s$ utilised can be a permutation obeying the following relationship:

$$\forall i \in \left[0; \frac{K}{R}-1\right], \forall j \in [0; R-1]: \Pi\left(i+\frac{K}{R}j\right) = \Pi_b(i) + \frac{K}{R}[\Pi_S(\Pi_b(i)_{modP})+j]_{modR} \quad (5)$$

wherein P is the period of the spatial permutation $\Pi_s$.

The spread of the new interleaver is then equal to roughly $\sqrt{K/R}$, rather than $\sqrt{K/RM_b}$.

Thanks to prunable interleavers it is possible to implement very flexible turbo-codes, both in terms of code-rate and block-length, basically at the same cost of a system that supports only a single configuration of the two parameters.

With the interleavers obtained according to the invention, one can design parallel turbo-decoders with the same flexibility, adding however a further degree of freedom. In fact, since the combination between temporal and spatial permutations is very simple, it is possible also to change the degree of parallelism of a turbo-decoder.

Thus, the invention also proposes a method for obtaining prunable S-random interleavers which are collision-free and have a pre-fixed degree of parallelism, and a length comprised between a minimum value $N_1$ and a maximum value $N_2$, and comprising the steps of:
- storing in memory devices a collision-free prunable S-random interleaver permutation having the prefixed degree of parallelism and a length with a value $N_{thr}$ comprised between $N_1$ and $N_2$, this permutation being obtained by an incremental method of the kind disclosed in the first portion of the present description;
- generating collision-free S-random interleaver permutations having a length comprised between $N_1$ and $N_{thr}$, by means of a pruning method applied to the above-mentioned permutation which is stored in the memory devices, and
- generating S-random interleaver permutations having a length comprised between $N_{thr}$ and $N_2$ by an incremental method based on the combination with a spatial permutation.

Thus, the shorter interleaver permutations have a limited degree of parallelism and exhibit optimum performances, whereas the larger ones benefit of a larger throughput and a lower latency.

It is thus possible, for instance, to obtain a degree of parallelism equal to 10 or 20, without being affected by a serious downgrading of the performances and this is due to a spread factor which is still sufficiently large.

The methods presented above provide interleavers in a wide range of sizes, with good spread properties. When a system needs to obtain one of them "on the fly", a pruning algorithm can be implemented.

In a first implementation, in which no combination of spatial and temporal permutations is used to cover the size range $[K_1\text{-}K_2]$, the turbo-decoder utilised needs 2M ROM memories and M SISO modules.

However, when spatial and temporal permutations are used, if $R=M/M_b$ indicates the ratio of the desired degree of parallelism to that of the temporal permutation, then $2M_b$ ROM memories are necessary for the temporal permutation and the values of vectors which are generated in the incremental method, and an additional ROM memory is also necessary, however with a smaller size, for the spatial permutation. Also in this case M SISO modules are necessary.

Figure 3:
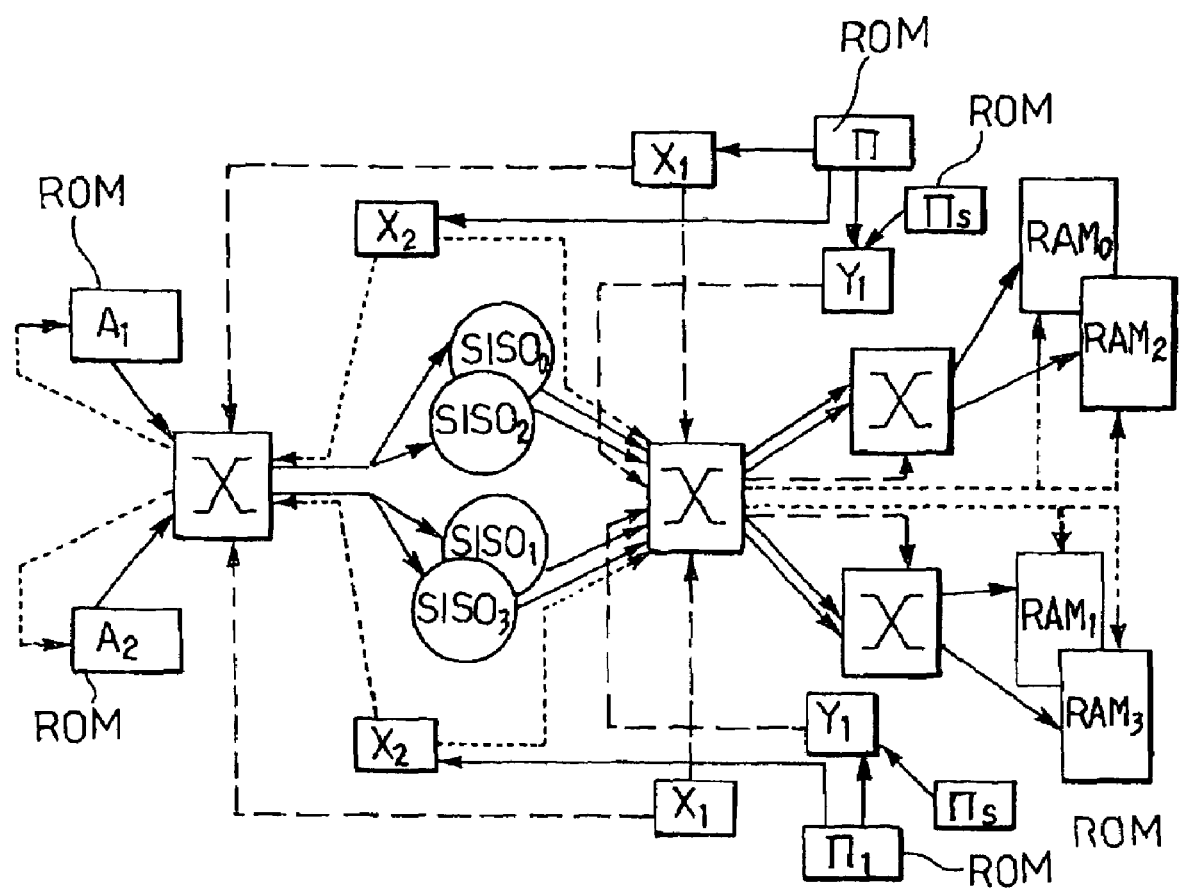
FIG. 3 is a diagrammatical representation of the architecture of a turbo-decoder for use with the interleavers obtained by a method according to the present invention.

In FIG. 3 there is diagrammatically shown the architecture of a parallel turbo-decoder, with a degree of parallelism of $M=4$, implemented combining twice a temporal permutation with a degree of parallelism of $M_b=2$.

The connections between the SISO modules and the RAM memory are ensured by the cascade arrangement of a first $M_b \times M_b$ cross-bar and $M_b=2$ R×R cross-bars. These cross-bars are configured in the second part of the iteration, by address information $X_1$ and $Y_1$ which are computed as a function of the interleaver law and the spatial permutation $\Pi_s$. Thereafter, the read-/write operation is enabled, or an extra-cycle is performed, depending on the information retrieved through the vectors $A_1$ and $A_2$, through the $M_b \times M_b$ cross-bar disposed on the left side of the figure, which is configured in accordance with the address information $X_1$.

It can be noted that for the R SISO modules the address information $X_1$ and $X_2$ are the same, and only the address information $Y_1$ is different for each of them, thus ensuring that they connect themselves to different RAM memories.

Naturally, the principle of the invention remaining the same, the forms of embodiment and the particulars of construction can be widely modified with respect to what has been described and illustrated by way of non-limiting example, without departing from the scope of the invention as defined in the annexed claims.

What is claimed is:

1. A method executed on a computing device having a processor and memory, the method operating on a current S-random interleaver permutation ($\Pi$), stored in the memory and having a spread S, a size K, and that is collision-free, the method for generating for use in a turbo-decoder an expanded S-random interleaver permutation with an increased size, which is also collision-free, through an expansion technique which is carried out by the processor connected to said memory, the method comprising:

iteratively adding to the current S-random interleaver permutation M terms or elements which satisfy the following relationship:

$$\forall i \in \left[0; \frac{K}{M} - 1\right], \forall j, k \in [0 \cdot M - 1], \text{ with } j \neq k:$$
$$\left[\prod\left(i + \frac{K}{M}j\right)/(K/M)\right] \neq \left[\prod\left(i + \frac{K}{M}k\right)/(K/M)\right]$$

wherein i,j,k are indices which indicate the position of the M terms or elements in the current S-random interleaver permutation, said M terms or elements being added in respective positions $i_z$ such that:

$$i_{z+1} = \left(i_z + \frac{K}{M}\right)_{modK}, z = 0, \ldots, K - 1$$

wherein the resultant expanded S-random interleaver permutation is used by a turbo-decoder in a communications device.

2. The method according to claim 1, wherein in each of said iterations, the choice of the values of the M terms or elements added to the current S-random interleaver permutation is made by a procedure which implements a predetermined optimisation criterion, adapted to maximise the value of the spread of a subsequent interleaver permutation.

3. The method according to claim 2, wherein at each iteration, the positions (i,j) and terms ($\Pi(i)$, $\Pi(j)$) of the current S-random interleaver permutation are identified that prevent the satisfaction of a spread value incremented by 1, and further comprising adding a new element into the current S-random interleaver permutation, in a position belonging to the interval $$[\min(i, j) + 1; \max(i, j)],$$

or a new element or term with a value belonging to the interval $$[\min((\prod(i), \prod(j)) + 1; \max(\prod(i), \prod(j))],$$

as long as such an insertion does not introduce any new spread violations.

4. The method according to claim 1, wherein M is greater than 5, and wherein the current S-random interleaver permutation with an increased size is obtained by combining a temporal permutation $\Pi_t$ and a spatial permutation $\Pi$.

5. The method according to claim 4, wherein for obtaining an S-random interleaver permutation of $M=M_b R$, wherein R is an integer, a collision-free S-random interleaver permutation is used as $M_b$ and satisfying the relationship $$\min\left(|\Pi(i) - \Pi(j)|, \frac{K}{M} - |\Pi(i) - \Pi(j)|\right) + \min\left(|i - j|, \frac{K}{M} - |i - j|\right) > S_{tr}.$$

6. The method according to claim 5, wherein as the spatial permutation $\Pi_s$ a permutation is used wherein:

$$\forall i \in \left[0; \frac{K}{M} - 1\right],$$

$$\forall j \in [0; R-1] : \prod\left(i + \frac{K}{R}j\right) = \prod_b(i) + \frac{K}{R}[\prod_s(\prod_b)(i)_{mod P}]$$

wherein P is the period of the spatial permutation $\Pi_s$.

7. A parallel turbo-decoder comprising:
a memory that stores a current S-random interleaver permutation $\Pi$ having a spread S, a size K and a degree of parallelism M<K, and that is collision-free; and
a processor connected to the memory that generates an expanded S-random interleaver permutation with an increased size, which is also collision-free, through an expansion technique, the processor operative to:
iteratively add M terms or elements to the current S-random interleaver permutation which satisfies the following relationship:

$$\forall i \in \left[0; \frac{K}{M} - 1\right], \forall j, k \in [0 \cdot M - 1], \text{ with } j \neq k :$$

$$\left[\prod\left(i + \frac{K}{M}j\right) / (K/M)\right] \neq \left[\prod\left(i + \frac{K}{M}k\right) / (K/M)\right]$$

wherein i,j,k are indices which indicate the position of the M terms or elements in the current S-random interleaver permutation, said M terms or elements being added in respective positions $i_z$ such that:

$$i_{z+1} = \left(i_z + \frac{K}{M}\right)_{mod K}, z = 0, \ldots, K-1.$$

8. A decoder according to claim 7, wherein during the iterations, the choice of the values of the M elements added to the current S-random interleaver permutation is made by implementing a predetermined optimisation criterion, adapted to maximise the value of the spread of the resulting S-random interleaver permutation.

9. The decoder according to claim 8, wherein at each iteration, the positions $$(i, j)$$

and terms $$(\prod(i), \prod(j))$$

of the current S-random interleaver permutation is identified that correspond to violations that prevent the result of a spread value incremented by 1, and a new element is inserted into the current S-random interleaver permutation, in a position belonging to the interval $$[\min(i, j) + 1; \max(i, j)],$$

or a new element or term with a value belonging to the interval $$[\min((\prod(i), \prod(j)) + 1; \max(\prod(i), \prod(j)))],$$

and this as long as such an insertion does not introduce any new spread violations.

10. The decoder according to claim 7, wherein M is greater than 5, and the expanded S-random interleaver permutation is obtained by combining a temporal permutation $\Pi_t$ and a spatial permutation $\Pi_s$.

* * * * *